United States Patent
Replogle et al.

(10) Patent No.: US 6,729,387 B2
(45) Date of Patent: May 4, 2004

(54) DOUBLE SIDED HEAT EXCHANGER CORE

(75) Inventors: Kris K. Replogle, Brookside, NJ (US); Quang Duong, Denville, NJ (US)

(73) Assignee: Avava Technology Corp., Basking Ridge, NJ (US)

( * ) Notice: Subject to any disclaimer, the term of this patent is extended or adjusted under 35 U.S.C. 154(b) by 0 days.

(21) Appl. No.: 10/167,953

(22) Filed: Jun. 12, 2002

(65) Prior Publication Data

US 2004/0035567 A1 Feb. 26, 2004

(51) Int. Cl.$^7$ .............................................. F28D 9/00
(52) U.S. Cl. ............... 165/140; 165/165; 165/DIG. 399
(58) Field of Search ................. 165/140, 165, 165/164

(56) References Cited

U.S. PATENT DOCUMENTS

| | | | |
|---|---|---|---|
| 1,601,637 A | * 9/1926 | Meigs | 165/166 |
| 3,829,945 A | * 8/1974 | Kanzler et al. | 29/890.03 |
| 3,983,933 A | * 10/1976 | Fletcher et al. | 165/164 |
| 4,040,804 A | * 8/1977 | Harrison | 96/118 |
| 4,140,175 A | 2/1979 | Darm | 165/115 |
| 4,148,357 A | * 4/1979 | Forster et al. | 165/140 |
| 4,314,607 A | 2/1982 | DesChamps | 165/69 |
| 5,303,771 A | 4/1994 | Des Champs | 165/165 |
| 5,558,155 A | 9/1996 | Ito | 165/80.3 |
| 5,761,811 A | 6/1998 | Ito | 29/890.054 |
| 5,832,988 A | 11/1998 | Mistry et al. | 165/103 |
| 6,155,338 A | 12/2000 | Endou et al. | 165/165 |

FOREIGN PATENT DOCUMENTS

EP 492799 A * 1/1992 ............. F28D/9/00

* cited by examiner

Primary Examiner—Allen Flanigan
(74) Attorney, Agent, or Firm—Thomas, Kayden, Horstemeyer & Risley, LLP

(57) ABSTRACT

A double sided-double heat exchanger core includes a plurality of sets of fluid passageways separated by a plurality of "S" shaped thermally conductive walls. Each set includes a plurality of fluid passageways. Each thermally conductive wall is configured to separate fluid flow between adjacent sets and configured to separate fluid flow between fluid passageways of one of the adjacent sets. The heat exchanger core is configured to provide segregated fluid flow between adjacent sets of fluid passageways. This heat exchanger core is particularly applicable for cooling equipment cabinets, wherein the air used to cool the equipment is recirculated through a plurality of sets and ambient air flows through interlaced sets to cool the recirculated air.

9 Claims, 6 Drawing Sheets

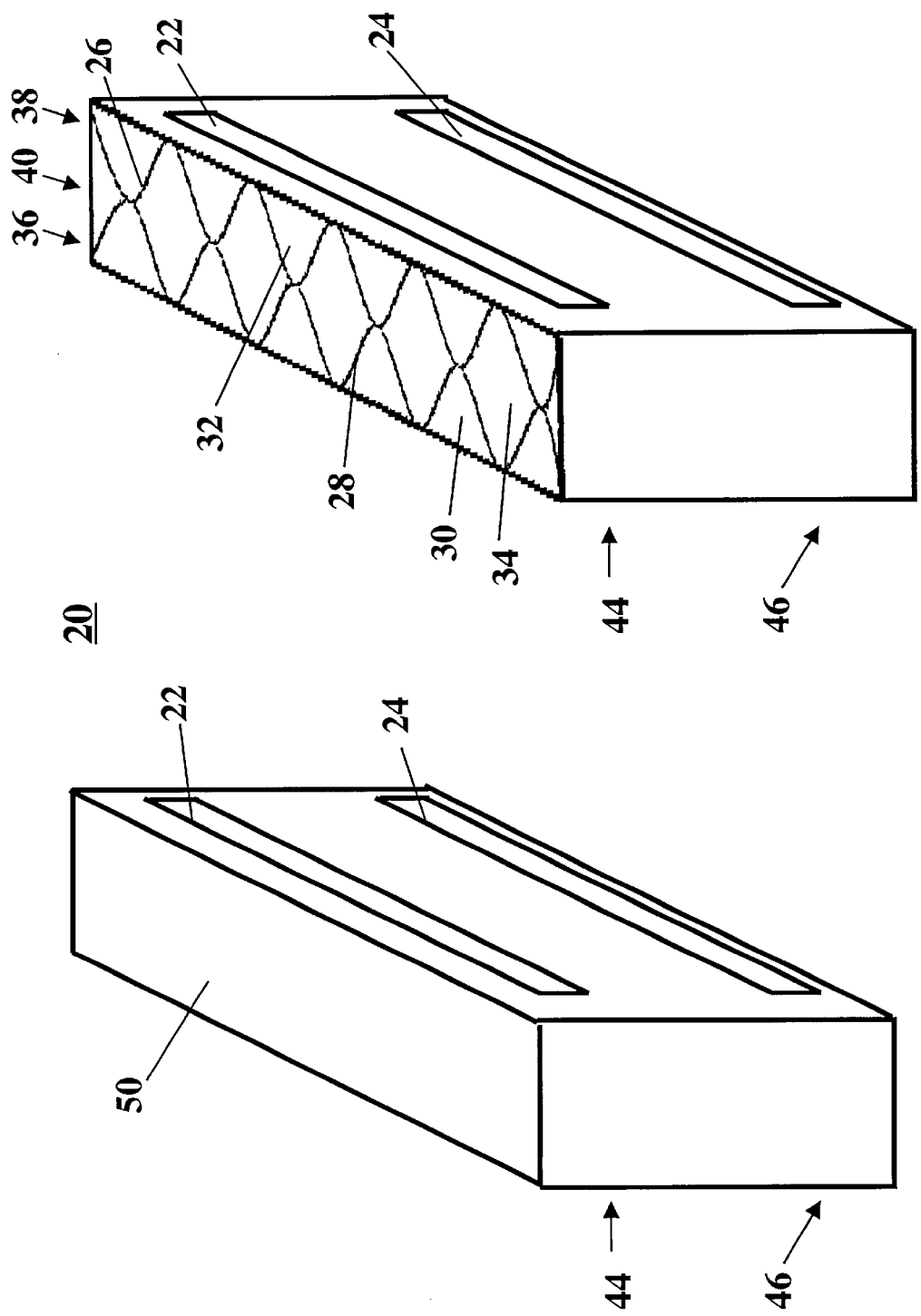

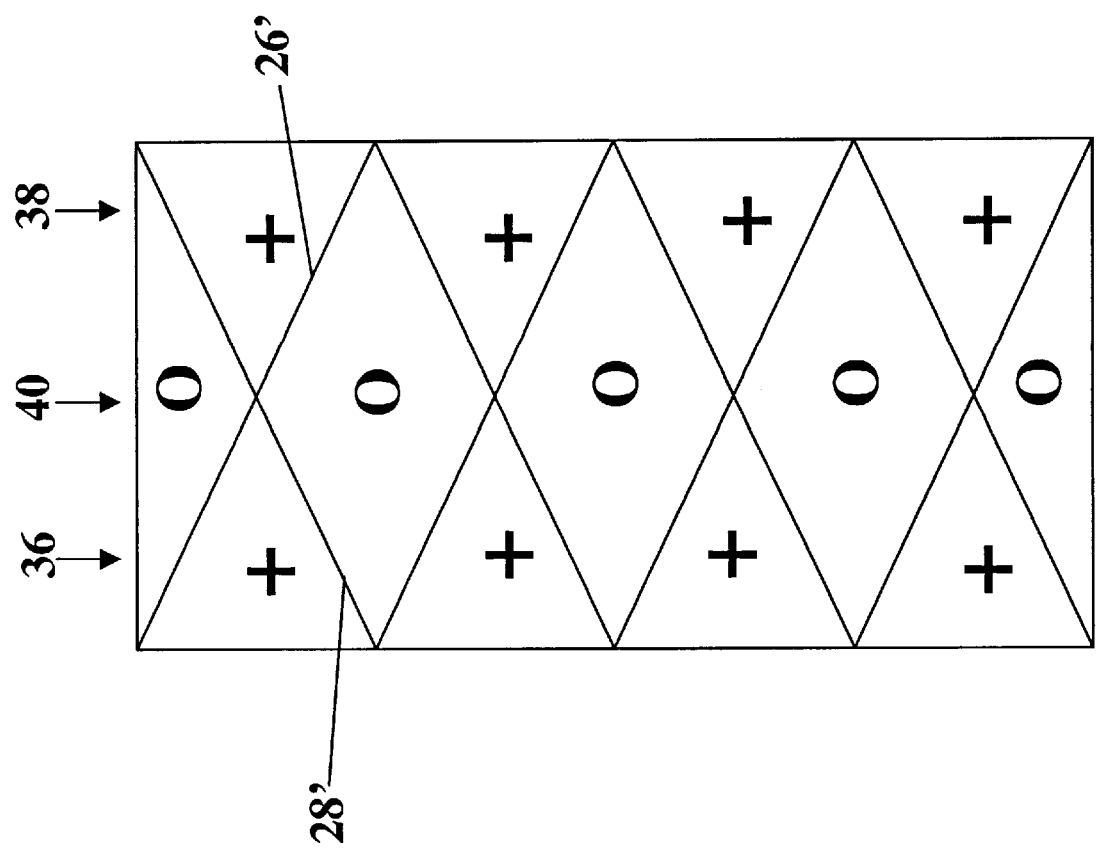

| 38 → | + | + | + | + | + | + |
|---|---|---|---|---|---|---|
| 40 → | O | O | O | O | O | O |
| 36 → | + | + | + | + | + | + |

FIGURE 6

DOUBLE SIDED HEAT EXCHANGER CORE

FIELD OF THE INVENTION

The present invention relates to heat exchangers and more specifically to heat exchanger core configurations.

BACKGROUND

Improvements in the design and construction of electronics, telecommunications, and optical fiber equipment and systems, have resulted in power densities and temperatures of these equipment and systems to increase. As known to those skilled in the art, typically, as the temperature of the equipment increases, the performance of the equipment, and the system of which the equipment is a part, degrades. As a result thereof, ways to cool the equipment and systems have been sought.

Examples of attempts to cool equipment housed within an equipment enclosure are disclosed in U.S. Pat. No. 4,949,218, issued to Blanchard, et al.; U.S. Pat. No. 5,570,740, issued to Flores, et al.; U.S. Pat. No. 5,603,376, issued to Hendrix; U.S. Pat. No. 5,765,743, issued to Sakiura et al.; and U.S. Pat. No. 5,832,988, issued to Mistry, et al. Common among these patents, is the construction of a heat exchanger or heat exchanging system directly within the enclosure, for the purpose of drawing and/or passing ambient air from outside the equipment enclosure through the enclosure for the purpose of cooling the equipment housed therein. Heat is exchanged through the use of structures that are relatively complicated in construction, and which increase the size, and necessarily the expense, of the enclosure in order to house the telecommunications or electronics equipment and the heat exchange system. Furthermore, these heat exchangers can not meet the demands of today's high density equipment and systems. Thus, a need exists for a heat exchanger, and particularly a heat exchanger core, that can meet the demands of today's modern equipment, without complicating the heat exchanger core's construction, and without overly increasing the size and expense of the heat exchanger core.

SUMMARY OF THE INVENTION

A heat exchanger core includes a plurality of sets of fluid passageways extending from a first end of the heat exchanger core to a second end of the heat exchanger core. Each set includes a plurality of fluid passageways. At least one thermally conductive wall extends from the first end of the heat exchanger core to the second end of the heat exchanger core. Each thermally conductive wall is positioned between adjacent sets of fluid passageways. Each thermally conductive wall is configured to separate fluid flow between adjacent sets and configured to separate fluid flow between fluid passageways of one of the adjacent sets. Adjacent thermally conductive walls are configured to separate fluid flow between fluid passageways of a set positioned between the adjacent walls. The heat exchanger core is configured to provide segregated fluid flow between adjacent sets of fluid passageways between the first end and the second end of the heat exchanger core.

BRIEF DESCRIPTION OF THE DRAWINGS

The above and other advantages and features of the present invention will be better understood from the following detailed description, which is provided in connection with the accompanying drawings. The various features of the drawings may not be to scale. Included in the drawing are the following figures:

FIG. 1A is an illustration of a heat exchange core on accordance with the present invention, with its top portion attached;

FIG. 1B is an illustration of the heat exchanger core with its top portion removed;

FIG. 5 is a top cross-sectional view of the heat exchange core having triangular shaped thermally conductive walls; and FIG. 6 is a top cross-sectional view of the heat exchanger core having thermally conductive walls forming a lattice structure

DETAILED DESCRIPTION

Figure 2A:
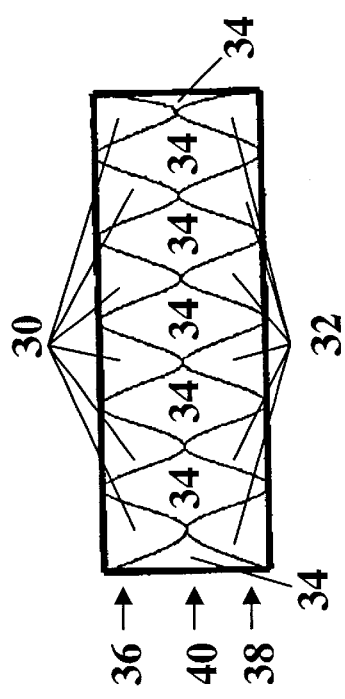
FIG. 2A is a top view of FIG. 1B.

This description of embodiments is intended to be read in connection with the accompanying drawing(s), which are to be considered part of the entire written description of this invention. In the description, relative terms such as "horizontal," "vertical," "up," "down," "top", "bottom", "front", "back", "forward", and "rearward", as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling, or connection that allows the pertinent structures to operate as intended by virtue of that relationship. The following description refers to an air-to-air heat exchanger core wherein thermal energy is transferred from a warm air current to a cooler one, it is understood that the heat exchanger core is applicable to heat transfer between any types of fluid.

Figure 2B:
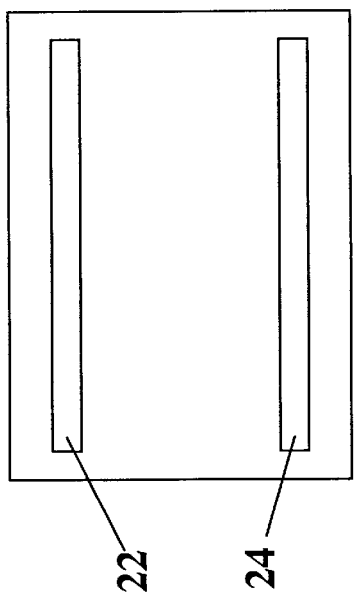
FIG. 2B is a right side view of FIG. 1B.
Figure 2C:
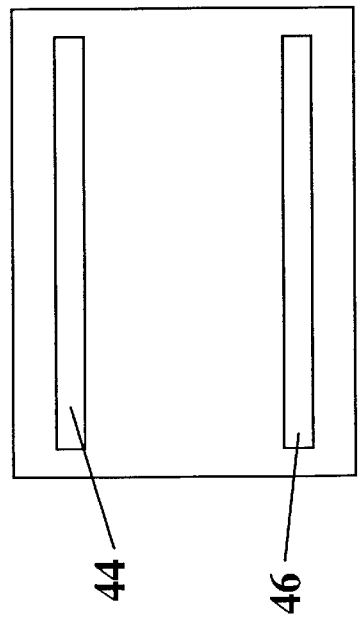
FIG. 2C is a left side view of FIG. 1B.

FIG. 1 shows a heat exchanger core 20 with and without the top portion 50. FIG. 1A shows heat exchange core 20 with top portion 50 attached. Top portion 50 may be configured to allow fluid flow therethrough. The configuration of inlet/exit ports formed by top portion 50 to allow fluid flow may vary considerably, and are thus not depicted in FIG. 1A. FIG. 1B shows heat exchanger core 20 with top portion 50 removed, revealing exemplary configurations of thermally conductive walls 26 and 28. Heat exchanger core 20 comprises a first inlet port 22, a first exit port 24, a second inlet port 44, a second exit port 46 (see FIG. 2C for ports 44 and 46), thermally conductive walls 26, 28, and a plurality of fluid passageways 30, 32, and 34. FIG. 2A shows a top view of FIG. 1B, FIG. 2B shows a right side view of FIG. 1B, and FIG. 2C shows a left side view of FIG. 1B. As shown in FIGS. 2B and 2C, heat exchanger core 20 comprises inlet ports 22, 44, and exit ports 24, 46, on both the left and right sides. Inlet port 22 and exit port 24 are in fluid communication with fluid passageways 32. Inlet port 44 and exit port 46 are in fluid communication with fluid passageways 30. Thus, fluid flowing into inlet port 22 flows through fluid passageways 32 and out exit port 24. Similarly, fluid flowing into inlet port 44 flows through fluid passageways 30 and out exit port 46. Each port 22, 24, 44, 46, may comprise a single opening or a plurality of openings.

Figure 3:
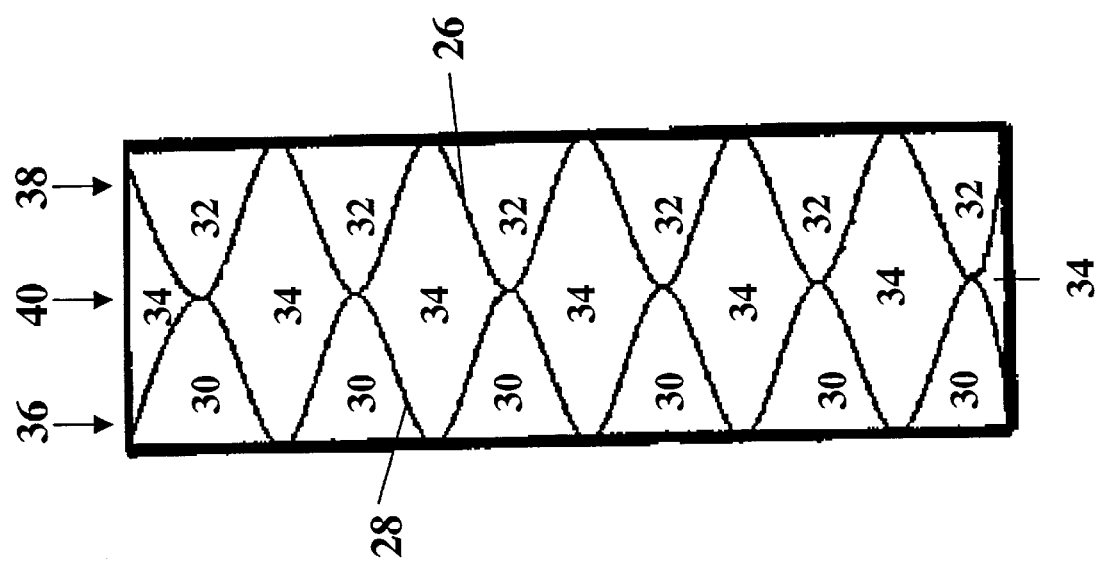
FIG. 3 is a top view of a cross section of the heat exchanger core showing the fluid passageways and thermally conductive walls.

Heat exchanger core 20 is configured to allow separate fluid flow through respective sets of fluid passageways. Referring to FIG. 3, set 36 comprises a plurality of fluid passageways 30, set 40 comprises a plurality of fluid passageways 34, and set 38 comprises a plurality of fluid passageways 32. Thus, fluid flowing through sets 36, 38, and 40 may be independent and separate from each other. For example, heat exchanger core 20 may be used to cool an equipment cabinet, wherein ambient air flows through set 40 of fluid passageways 34 and air within the cabinet is recirculated and flows through sets 36 and 38 of fluid passageways 30 and 32, respectively. This example will be used to describe fluid flow through heat exchanger core 20. It is understood, however, that the direction of fluid flow is a design choice dependent upon a particular application of heat exchanger core 20.

Figure 4B:
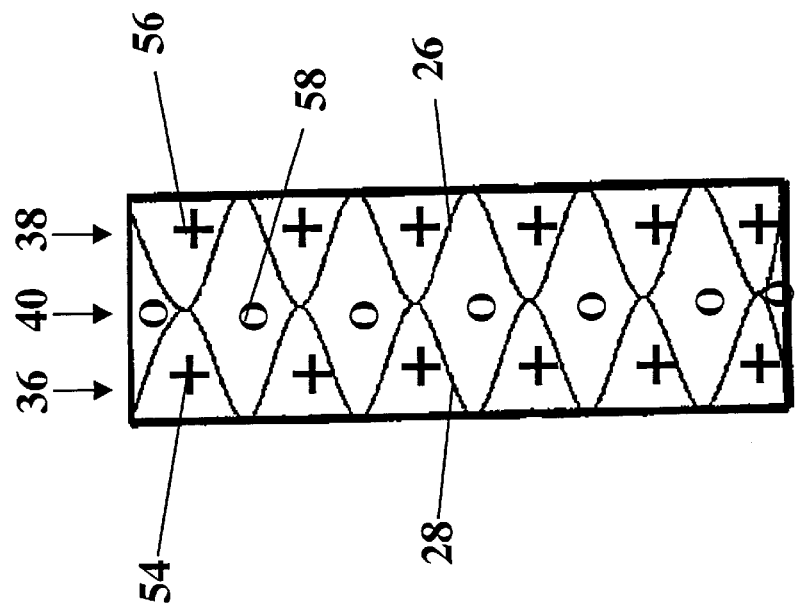
FIG. 4B is a top view of the heat exchanger core showing exemplary directions of fluid flow.
Figure 4A:
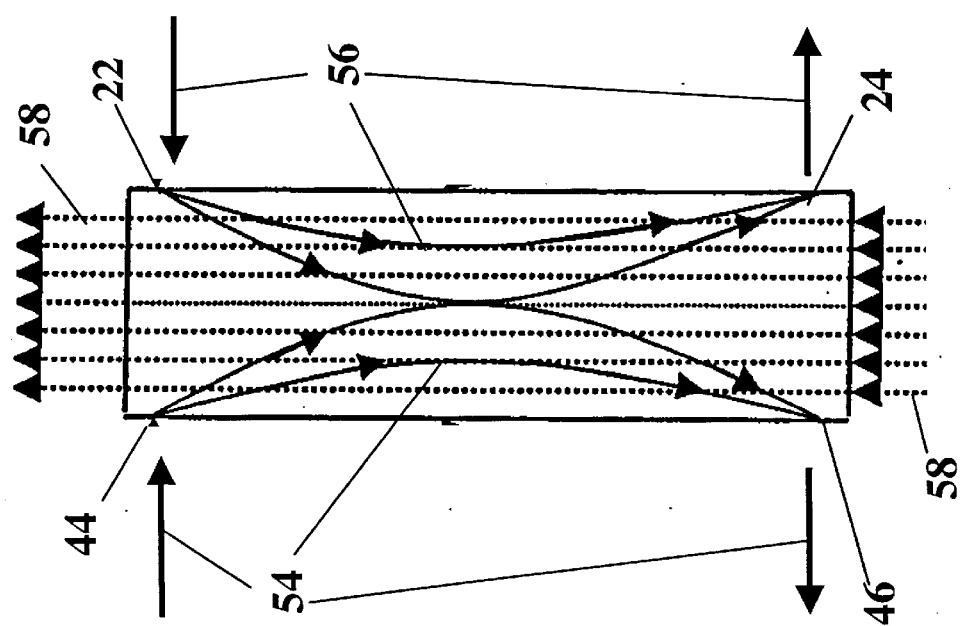
FIG. 4A is a front view of the heat exchanger core showing exemplary directions of fluid flow.

FIGS. 4A and 4B show exemplary directions of fluid flow through heat exchanger core 20 from a front view and a top view, respectively. In FIG. 4A, fluid flows from a first end (top) of heat exchanger core 20 to a second end (bottom) of heat exchanger core 20 as indicated by arrows 54 and 56. Concurrently, fluid flows from the bottom of heat exchanger core 20 to the top of heat exchanger core 20 as indicated by arrows 58. In accordance with the above example, arrows 56 indicate the flow of recirculated air entering the heat exchanger core 20 through inlet port 22 and exiting heat exchanger core 20 through exit port 24. Recirculated air also enters the heat exchanger core 20 through inlet port 44 and exist heat exchanger core 20 through exit port 46, as indicated by arrows 54. At the same time, as indicated by arrows 58, ambient air flows through the heat exchanger core 20 from the bottom to the top, to cool the recirculated air flowing from the top to the bottom. The recirculated air flows through sets 36 and 38 of fluid passageways 30 and 32, respectively, and the ambient air flows through set 40 of fluid passageways 34, as shown in FIG. 4B. In FIG. 4B, the "+" symbol represents fluid flow into the plane of the paper, and the "o" symbol represents fluid flow out of the plane of the paper.

As shown in FIGS. 4A and 4B, the direction of fluid flow is opposite in adjacent sets of fluid passageways. Although the direction of fluid flow is application dependent, this counter fluid flow tends to provide better performance (more efficient cooling) than fluid flowing in the same direction in all sets of fluid passageways. The arcuate path of fluid flow within the heat exchanger core 20, as indicated by arrows 54 and 56, through sets 36 and 38, respectively, provides more efficient cooling as compared to fluid flowing in a non-arcuate path. Within the heater core 20, the fluid flowing through sets 36, 38, and 40 are separate. That is, within the heater core 20, fluid flowing through set 36 is isolated from fluid flowing though sets 40 and 38, fluid flowing through set 38 is isolated from fluid flowing though sets 40 and 36, and fluid flowing through set 40 is isolated from fluid flowing though sets 36 and 38. The separation of fluid flows prevents one fluid flow from being contaminated by another fluid flow.

Thermally conductive walls 26 and 28 provide a means for thermal energy to be transferred between fluid flowing in adjacent sets of fluid passageways. The thermally conductive walls may comprise any appropriate thermally conductive material such as metal (e.g., extruded aluminum), ceramic, or a combination thereof. The thermally conductive walls may also comprise fins or other appropriate protrusions to increase thermal conductivity. To provide better thermal conductivity, thermally conductive walls 26, 28 are formed to be as thin as practicable, while maintaining structural integrity. In an exemplary embodiment of the heat exchanger 20, the thermally conductive walls are approximately 0.005 inches thick. Each thermally conductive wall 26, 28, extends from the top to bottom of heat exchanger 20.

Thermally conductive walls 26 and 28 are configured to separate fluid flow between adjacent sets of fluid passageways, and to separate fluid flow between fluid passageways in a set. That is, the fluid flowing between sets 36, 40, and 38 are separated from each other; and fluid flowing in any one of fluid passageways 30, 32, 34 is separated from the rest of fluid passageways 30, 32, 34. Each thermally conductive wall 26, 28 is positioned between adjacent sets of fluid passageways 36, 40, 38. As shown in FIG. 3, thermally conductive wall 28 is positioned between sets 36 and 40, and thermally conductive wall 26 is positioned between sets 38 and 40. Each thermally conductive wall (e.g., thermally conductive wall 28) is configured to separate fluid flow between adjacent sets (e.g., sets 36 and 40) and configured to separate fluid flow between fluid passageways of one of the adjacent sets (e.g., fluid passageways 30). Adjacent thermally conductive walls (e.g., thermally conductive walls 28 and 26) are configured to separate fluid flow between fluid passageways of a set positioned between the adjacent walls (e.g., fluid passageways 34).

Figure 6:
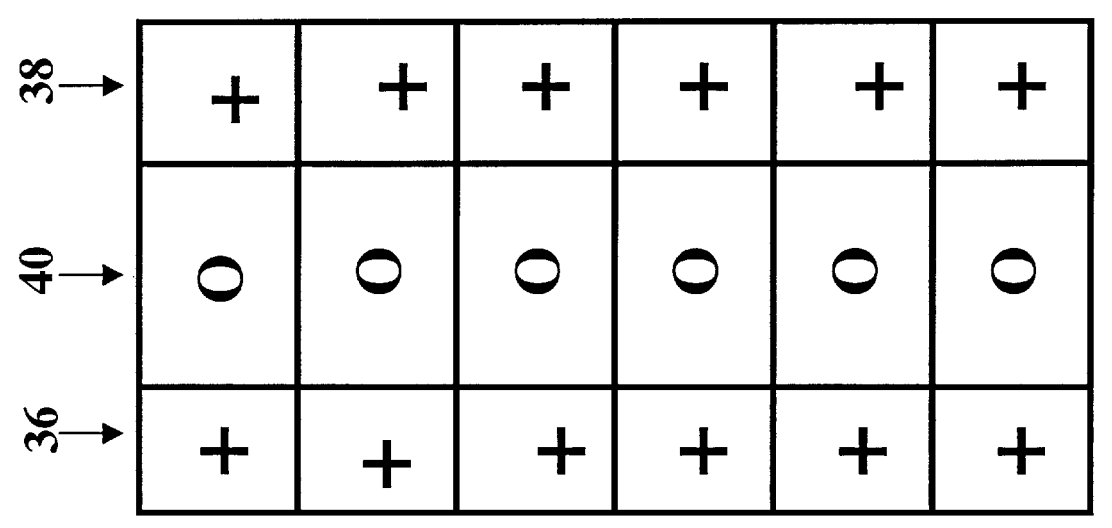

A cross section of each thermally conductive wall 26, 28, as shown in FIGS. 1B, 2A, 3, and 4B is sinusoidal in shape. This sinusoidal cross-section and alignment of thermally conductive walls 26 and 28 provides increased surface area, as compared to prior art heat exchanger cores. Increased surface area provides more efficient cooling. FIGS. 5 and 6 show alternate embodiments of thermally conductive walls. FIG. 5 shows a top cross section of thermally conductive walls 26' and 28', which are triangular in shape. FIG. 6 shows a top cross section of the thermally conductive walls forming a lattice structure. An exemplary direction of fluid flow is indicted by the symbols "+" and "o", wherein the "+" symbol represents fluid flow into the plane of the paper, and the "o" symbol represents fluid flow out of the plane of the paper.

Although the heat exchanger core 20 is described in terms of exemplary embodiments, it is not limited thereto. Rather, the appended claims should be construed broadly, to include other variants and embodiments, which may be made by those skilled in the art without departing from the scope and range of equivalents of a heat exchanger core in accordance with the present invention. For example, the heat exchanger core 20 may comprise more than three sets of fluid passageways. Each set may comprise only a single fluid passageway or a plurality of fluid passageways. Also, each inlet or exit port may comprise a separate opening, wherein each opening is in fluid communication with a separate and respective fluid passageway.

What is claimed is:

1. A heat exchanger core comprising a housing having a first end and a second end, side walls, and a top and bottom;

a plurality of sets of fluid passageways extending from said top to said bottom, each set comprising a plurality of fluid passageways isolated from each other and from adjacent passageways, said sets of passageways being formed by a first serpentine shaped thermally conductive wall extending from said top to said bottom of said housing, said wall forming a first set of isolated passageways each having sloping walls;

a second serpentine shaped thermally conductive wall extending from said top to bottom of said housing, said second wall forming a second set of isolated passageways each having sloping walls;

said first and second walls being in contact with each other at a plurality of points extending from top to bottom of the housing to form a third set of isolated passageways having a substantially diamond shaped cross-section, each having a cross-sectional area greater than each of said channels in said first and second sets, said third set of passageways being adapted to receive cooling fluid and keep it isolated from the passageways of said first and second sets;

the passageways of said first, second, and third sets each being isolated from adjacent passageways;

the first and second sides of said housing being contacted respectively by said first and second walls at a plurality of points along the length thereof from top to bottom to isolate each of said passageways;

said housing having openings in the sides thereof for introducing and extracting fluid to be cooled from each said individual passageway in said first and second sets.

2. A heat exchanger core in accordance with claim 1, wherein each thermally conductive wall is corrugated.

3. A heat exchanger core in accordance with claim 2, wherein a cross section of each thermally conductive wall is approximately triangular in shape.

4. A heat exchanger core in accordance with claim 2, wherein a cross section of each thermally conductive wall is approximately sinusoidal in shape.

5. A heat exchanger core in accordance with claim 1 wherein a cross section of said plurality of thermally conductive walls is lattice shaped.

6. A heat exchanger core in accordance with claim 1 wherein said heat exchanger core is configured to allow opposite direction fluid flow in adjacent sets of fluid channels, fluid flow in alternative sets being in the same direction.

7. A heat exchanger core in accordance with claim 6, wherein fluid flowing in a first direction comprises ambient air and fluid flowing in a second direction comprises ambient air and fluid flowing a a second direction comprises recirculated air.

8. A heat exchanger core in accordance with claim 1, wherein each thermally conductive wall is approximately 0.005 inches thick.

9. A heat exchanger core in accordance with claim 1, wherein each thermally conductive wall comprises heat sink fins.

* * * * *